(12) United States Patent
Yoshida

(10) Patent No.: US 7,205,197 B2
(45) Date of Patent: Apr. 17, 2007

(54) METHOD OF FABRICATING A NONVOLATILE SEMICONDUCTOR MEMORY

(75) Inventor: Katsuji Yoshida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/335,682

(22) Filed: Jan. 20, 2006

(65) Prior Publication Data

US 2006/0183285 A1    Aug. 17, 2006

(30) Foreign Application Priority Data

Feb. 16, 2005    (JP) .............................. 2005-039008

(51) Int. Cl.
*H01L 21/8247* (2006.01)

(52) U.S. Cl. ................ 438/264; 438/704; 257/E21.179

(58) Field of Classification Search ........ 438/257–267, 438/704; 257/E21.179
See application file for complete search history.

(56) References Cited

U.S. PATENT DOCUMENTS 5,595,926 A * 1/1997 Tseng .......................... 438/243
6,586,301 B2    7/2003 Orita
7,030,025 B2 *  4/2006 Sinozawa .................... 438/704

FOREIGN PATENT DOCUMENTS

JP    2002-100688    4/2002

* cited by examiner

*Primary Examiner*—Richard A. Booth
(74) *Attorney, Agent, or Firm*—Volentine & Whitt, P.L.L.C.

(57) ABSTRACT

In a process for fabricating a nonvolatile semiconductor memory of the tunneling type, when tunnel windows are formed in an oxide film on a semiconductor substrate, the oxide film is etched first by a dry etching process, then by a wet etching process. The dry etching process quickly removes most of the oxide material in the window areas, without enlarging the windows laterally, but stops short of the substrate, thereby avoiding damage to the substrate surface. The wet etching process takes the windows the rest of the way down to the semiconductor substrate surface. Since only a small amount of oxide needs to be wet-etched, lateral enlargement of the windows by the wet etching process can be tightly controlled, and small tunnel windows can be formed without the need for extravagantly sophisticated fabrication equipment.

8 Claims, 3 Drawing Sheets

METHOD OF FABRICATING A NONVOLATILE SEMICONDUCTOR MEMORY

BACKGROUND OF THE INVENTION

1. Field of the Invention

The present invention relates to a method of fabricating a nonvolatile semiconductor memory of the type that writes and erases data by electron tunneling.

2. Description of the Related Art

A memory cell in this type of memory has a floating gate electrode, a control gate electrode, a thin gate oxide film that insulates the floating gate electrode from the silicon substrate of the cell, and a still thinner tunnel oxide film occupying a window in the gate oxide film. Data are written and erased by moving electrons into and out of the floating gate electrode through the thin tunnel oxide film. Common examples of memories with this structure include electrically erasable and programmable read-only memories (EEPROM).

The tunnel oxide film in an EEPROM of this type is generally fabricated by photolithography and oxidation in the following steps: an oxide film with a thickness slightly less than the desired thickness of the gate oxide film is formed on the substrate; a resist mask with an opening is formed; the oxide film is wet-etched through the opening with hydrofluoric acid or buffered hydrofluoric acid to form the tunnel window; the resist mask is removed; the exposed substrate is cleaned and then thermally oxidized, forming the tunnel oxide film at the bottom of the tunnel window.

Wet etching has the advantage of not damaging the substrate surface, so that a tunnel oxide film of good quality can be formed. However, wet etching also has the disadvantage of being isotropic: etching proceeds laterally, parallel to the substrate, as well as forward toward the substrate, so that the tunnel window becomes larger than the opening in the resist mask. To form a tunnel window of a given size, it is therefore necessary to use photolithographic equipment with a significantly higher resolution than the window dimensions.

EEPROM circuits and other circuits comprising metal-oxide-semiconductor (MOS) transistors are often combined in the same device, the EEPROM memory cells and the MOS transistors having similar dimensions. An ongoing trend in semiconductor fabrication technology is to shorten the gate length of MOS transistors to increase their operating speed. Since the floating and control gates in the EEPROM memory cells are similarly shortened, the size of the tunnel windows in the EEPROM must be reduced to match the gate length of the MOS transistors. Because of the lateral expansion of the tunnel windows during wet etching, it becomes necessary to use photolithographic equipment with a higher resolution than is needed to form the MOS transistors. This is costly and inefficient, but it would also be costly and inefficient to use two different photolithographic processes: one to form the MOS transistors, and another to form the tunnel windows.

In an EEPROM fabrication method described in Japanese Patent Application Publication No. 2002-100688, for example, (paragraphs 0016–0018 and FIG. 3), instead of a wet etching process, a dry anisotropic plasma etching process is used to form the tunnel windows. This enables tunnel windows to be created with the same dimensions as the openings in the resist mask, so higher-resolution photolithographic equipment is not needed, but plasma etching damages the substrate surface. The tunnel oxide film formed on the substrate surface is therefore of poor quality and is susceptible to dielectric breakdown, which allows unwanted charge to leak between the floating gate and substrate when an electric field is applied from the control gate.

SUMMARY OF THE INVENTION

An object of the present invention is to provide a fabrication method that can form minute tunnel oxide films of good quality in a nonvolatile semiconductor memory without lowering the manufacturing efficiency.

The invented method of fabricating a nonvolatile semiconductor memory includes the conventional steps of forming an oxide film on the surface of a silicon substrate and forming a resist mask with an opening defining each desired tunnel window on the oxide film, but the size of the opening is only slightly smaller than the design size of the tunnel window.

Next, the oxide film is etched through the openings by an anisotropic dry etching process, using the resist mask as an etching mask. This anisotropic dry etching process stops short of the silicon substrate, preferably at least five nanometers short, so that it does not damage the substrate surface.

A wet etching process is then performed with the same resist mask to remove the oxide film down to the surface of the substrate. Since only a small thickness of oxide remains to be etched, the wet etching process is completed quickly and only a small amount of lateral etching takes place. The wet etching process leaves an undisturbed substrate surface on which a tunnel oxide film of high quality can be formed.

The invented fabrication method is efficient because the openings in the resist mask have nearly the same dimensions as the tunnel windows, and can be formed by a photolithographic process of the same resolution as used to form gate electrodes and other circuit features. The invented fabrication method is also efficient in that most of the oxide in the tunnel windows can be removed by dry etching, which is faster than wet etching.

DETAILED DESCRIPTION OF THE INVENTION

Figure 1:
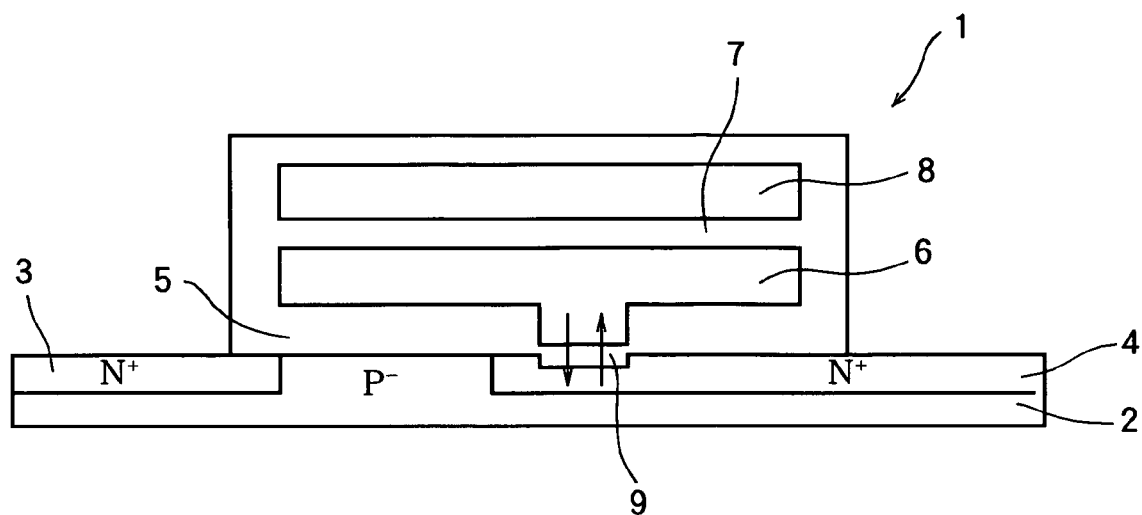
FIG. 1 is a sectional view of an EEPROM memory cell manufactured by a process embodying the present invention.

An embodiment of the invention will now be described with reference to the attached drawings, in which like elements are indicated by like reference characters.

First Embodiment

Referring to FIG. 1, an EEPROM cell 1 used in a nonvolatile semiconductor memory includes a silicon substrate 2 doped with a p-type impurity, a source 3 and a drain 4 formed in the silicon substrate 2 and doped with an n-type impurity, a gate oxide film 5 bridging the channel between the source 3 and drain 4, a floating gate electrode 6 resting on the gate oxide film 5, facing the silicon substrate 2 through the gate oxide film 5, an insulating film 7 covering other surfaces of the floating gate electrode 6, a control gate electrode 8 formed above the floating gate electrode 6, separated from it by the insulating film 7 and functioning in the same way as the gate electrode of an ordinary MOS transistor, and a tunnel oxide film 9 disposed at the bottom of a window in the gate oxide film 5. The tunnel oxide film 9 is a thin oxide film through which electrons can tunnel between the floating gate electrode 6 and the substrate 2.

A method of fabricating the tunnel oxide film 9 will be described with reference to FIGS. 2A to 2F, which indicate the following additional features: a resist mask 11 formed by exposing and developing a photoresist coating on an oxide film 12 that becomes the gate oxide film 5; a circular or elliptical tunnel window area 13 (e.g., a circular area with a diameter of 0.4 to 0.45 μm) in which the tunnel oxide film 9 is formed; an opening 14 in the resist mask 11 inside the tunnel window area 13; and the tunnel window 15, which has the same dimensions as the tunnel window area 13 and extends through the oxide film 12 or gate oxide film 5 down to the silicon substrate 2.

Figure 2A:
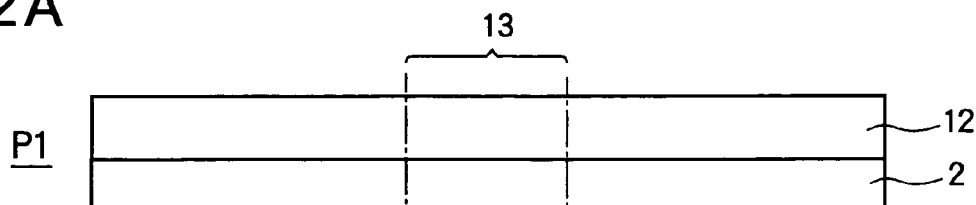
FIGS. 2A to 2F illustrate steps in a tunnel oxide film fabrication process embodying the present invention.

In the first fabrication step or process P1 illustrated in FIG. 2A, the oxide film 12 is formed by thermal oxidation of the surface of the silicon substrate 2. The oxide film 12 is a thin layer of silicon dioxide ($SiO_2$), slightly thinner than the intended thickness of the gate oxide film.

Figure 2B:
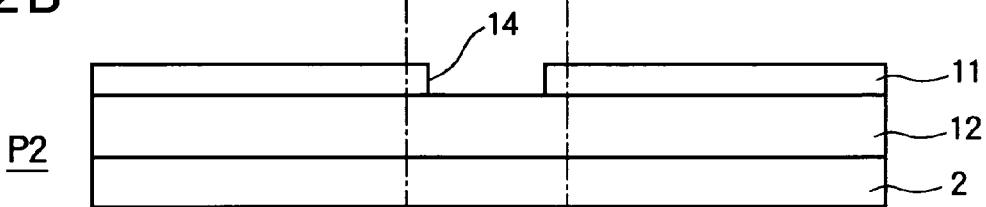

In the second process P2 illustrated in FIG. 2B, a layer of photoresist is coated onto the surface of the oxide film 12, exposed to light through an optical mask (not shown), and developed to form the resist mask 11. The opening 14 formed in the resist mask 11 defines the tunnel window area 13 in which the tunnel oxide film 9 will be formed, but the opening 14 is slightly smaller than the tunnel window area 13.

Figure 2C:
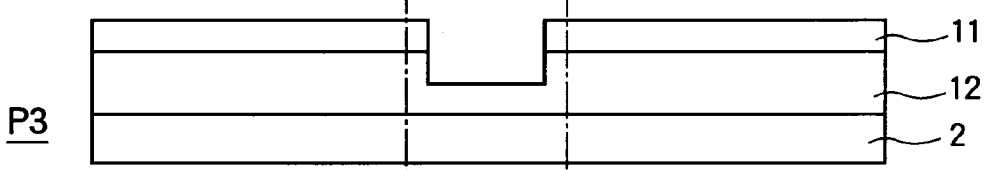

The third process P3 illustrated in FIG. 2C is a dry etching process, more specifically an anisotropic plasma etching process, that etches the oxide film 12 below the opening 14 in the resist mask 11. The duration of the process is controlled so that the etching stops short of the substrate 2, leaving a thickness of five nanometers (5 nm) of oxide film 12 intact. The etching gas is a mixture of argon (Ar) supplied at a rate of one thousand standard cubic centimeters per minute (1000 sccm), carbon tetrafluoride ($CF_4$) supplied at 45 sccm, and trifluoromethane ($CHF_3$) supplied at 45 sccm. The plasma pressure is 1.6 torr and the radio-frequency (RF) power that ionizes the plasma is one hundred watts (100 W). The 5-nm remaining thickness of the oxide film 12 is adequate to protect the surface of the silicon substrate 2 from plasma damage at these etching conditions.

Figure 2D:
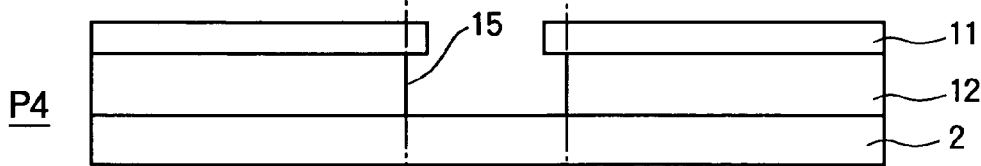

The fourth process P4 illustrated in FIG. 2D is a wet etching process that removes the remaining thickness of the oxide film 12 in the tunnel window area 13. The etching fluid is dilute hydrofluoric acid or buffered hydrofluoric acid. This wet etching process is isotropic and proceeds downward and laterally by similar amounts, but because the remaining thickness of the oxide film 12 is only 5 nm, the etching process can be accurately controlled to stop when the surface of the silicon substrate 2 is exposed. The amount of lateral etching is thus also accurately controllable to give the completed tunnel window 15 dimensions matching the intended tunnel window area 13.

Figure 2E:
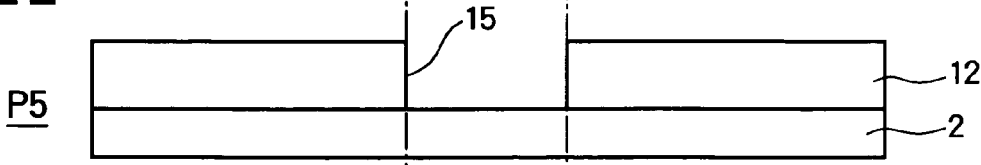

In the fifth process P5 illustrated in FIG. 2E, the resist mask 11 is removed by use of a stripping agent, and the exposed surfaces of the oxide film 12 and silicon substrate 2 are cleaned.

Figure 2F:
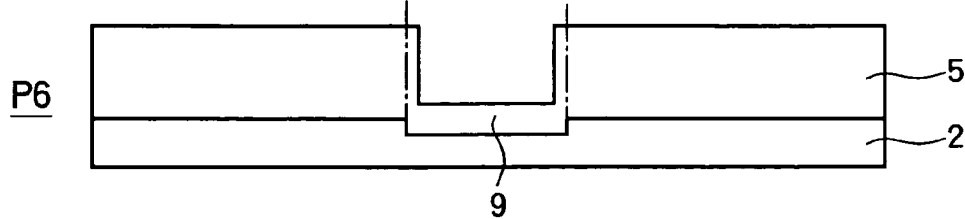

The sixth process P6 illustrated in FIG. 2F is a thermal oxidation process that oxidizes the surface of the silicon substrate 2 exposed at the bottom of the tunnel window 15 to form a thin film of silicon dioxide, this being the tunnel oxide film 9. The surface of the silicon substrate at the interface with the oxide film 12 is also oxidized, increasing the thickness of the oxide film 12 to the intended gate oxide thickness, so that the oxide film 12 becomes the gate oxide film 5.

Following the process steps illustrated in FIGS. 2A to 2F, the source 3 and drain 4 shown in FIG. 1 are formed in the silicon substrate 2, and the floating gate electrode 6, insulating film 7, and control gate electrode 8 are formed. The processes by which these elements are formed are well known; detailed descriptions will be omitted.

Tests were carried out by the inventor to determine how the durability of the tunnel oxide film 9 varied depending on the thickness of the oxide film 12 left by the dry etching process P3. Oxide films 12 were etched under the conditions given in process P3 for various times, selected to leave various oxide thicknesses. The remaining oxide was then removed by wet etching and tunnel oxide films were formed as in processes P4 to P6. The tunnel oxide films were evaluated by the time-dependent dielectric breakdown (TDDB) method, and the times to dielectric breakdown were compared. The results are indicated by the graph in FIG. 3: the thickness of the oxide film 12 left in step P3 is shown on the horizontal axis; the time until dielectric breakdown is indicated on the vertical axis by an index normalized so that the dielectric breakdown time for a remaining oxide thickness of 13.2 nm is equal to unity.

Figure 3:
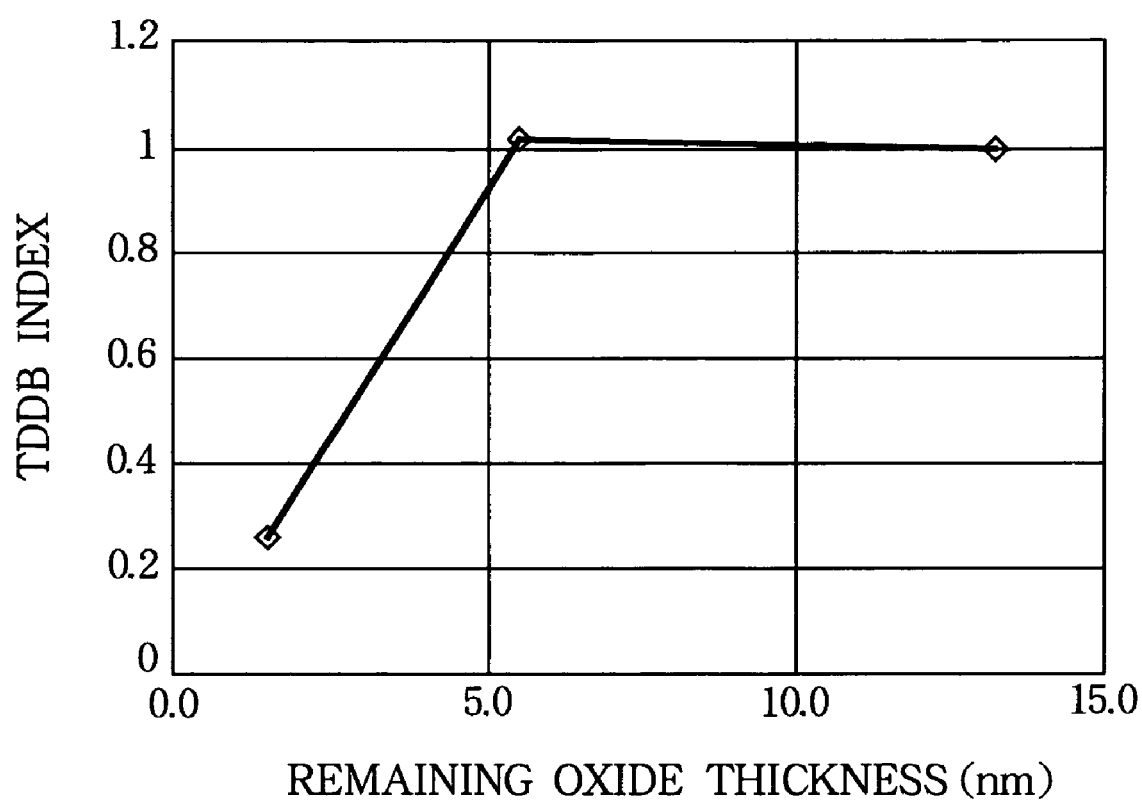
FIG. 3 is a graph showing time-dependent dielectric breakdown indices of the tunnel oxide film as a function of the film thickness left after dry etching.

As FIG. 3 shows, when the remaining oxide thickness is less than 5 nm, the quality of the tunnel oxide film 9 decreases rapidly with decreasing oxide thickness left in process P3, as indicated by increasingly short dielectric breakdown times. When the remaining oxide thickness is greater than 5 nm, the tunnel oxide film 9 is stable and the dielectric breakdown time remains the same regardless of the remaining oxide thickness in process P3. This indicates that to avoid damage to the silicon surface in process P3 and form a tunnel oxide film 9 of good quality in step P6, the remaining oxide thickness in step P3 should be 5 nm or greater.

It is also desirable for the etching depth in the dry etching process P3 to be at least 80% of the thickness of the oxide film 12. If the etching depth is less than 80%, the subsequent wet etching process P4 will take significant time, wet etching being slower than dry etching, and the fabrication process will become inefficient. Longer wet etching times also lead to greater variability in the amount of lateral etching, making it difficult to control the size of the tunnel window 15 accurately. The desirable range of remaining oxide thickness is therefore from 5 nm to 20% the thickness of the oxide film 12, with a value at or near 5 nm being most preferable.

By using dry etching for the greater part of the tunnel window etching process and using wet etching only to remove the thin remaining oxide left by dry etching, the invented fabrication process can control the lateral expansion of the tunnel windows and form tunnel windows with sizes matching the gate lengths of MOS transistors, without having to resort to a costly and in some cases impractical photolithographic process capable of forming features significantly smaller than the gate lengths of the MOS transistors. EEPROM cells and MOS transistors of similar dimensions can accordingly be formed efficiently on a single wafer fabrication line.

The invention also provides a way to form small tunnel windows quickly (by removing at least 80% of the oxide film by dry etching), without damaging the underlying silicon surface (by leaving at least 5 nm of the oxide film to be removed by wet etching), and without the need for photolithographic equipment having a resolution much higher than the tunnel window dimensions.

The invention has been described through a single embodiment, but those skilled in the art will recognize that variations are possible within the scope of the invention, which is defined in the appended claims.

What is claimed is:

1. A method of fabricating a nonvolatile semiconductor memory having a silicon substrate, a gate oxide film formed on the silicon substrate, a floating gate electrode separated from the silicon substrate by the gate oxide film, and a tunnel oxide film formed within the gate oxide film, the tunnel oxide film permitting electrons to tunnel into and out of the floating gate electrode to write and erase data, the method comprising:

obtaining a silicon substrate having a tunnel oxide film formation area on one surface;

forming an oxide film having a predetermined thickness on said surface of the silicon substrate;

forming a resist mask having an opening within the tunnel oxide film fabricating area on the oxide film;

etching the oxide film through the opening by an anisotropic dry etching process employing a mixture of argon, carbon tetrafluoride, and trifluoromethane etching gases, using the resist mask as an etching mask, the anisotropic dry etching process proceeding to a certain depth but stopping short of the surface of the silicon substrate and not exposing the surface of the silicon substrate;

etching the remaining oxide film exposed in the opening by a wet etching process that proceeds down to the surface of the silicon substrate, again using the resist mask as an etching mask, thereby forming a tunnel window; and forming the tunnel oxide film in the tunnel window.

2. The fabrication method of claim 1, wherein the dry etching process stops at least five nanometers short of the surface of the silicon substrate.

3. The fabrication method of claim 1, wherein the dry etching process stops substantially five nanometers short of the surface of the silicon substrate.

4. The fabrication method of claim 1, wherein the depth to which the dry etching process proceeds is equal to at least eighty percent of the thickness of the oxide film.

5. The fabrication method of claim 1, wherein the dry etching process is performed at a pressure of substantially 1.6 torr.

6. The fabrication method of claim 1, wherein the dry etching process is performed at a radio-frequency power of substantially one hundred watts.

7. The fabrication method of claim 1, wherein forming the tunnel oxide film comprises a thermal oxidation process that also increases the thickness of the oxide film to convert the oxide film to the gate oxide film.

8. The fabrication method of claim 1, wherein the dry etching process supplies said argon at a rate of substantially one thousand standard cubic centimeters per minute (sccm), said carbon tetrafluoride at a rate of substantially forty-five sccm, and said trifluoromethane at a rate of substantially forty-five sccm.

* * * * *